United States Patent [19]

Rothermel et al.

[11] Patent Number: 5,469,089
[45] Date of Patent: Nov. 21, 1995

[54] CIRCUIT ARRANGEMENT FOR REGULATING SIGNALS

[75] Inventors: Albrecht Rothermel; Günter Gleim; Karin Rothermel, all of Villingen, Germany

[73] Assignee: Deutsche Thomson-Brandt GmbH, Villingen-Schwenningen, Germany

[21] Appl. No.: 387,969

[22] Filed: Feb. 10, 1995

Related U.S. Application Data

[63] Continuation of Ser. No. 9,468, Jul. 26, 1993, abandoned.

[30] Foreign Application Priority Data

May 28, 1990 [DE] Germany .......................... 40 17 124.8

[51] Int. Cl.[6] .............................. H03K 5/19; H03K 5/00; H03K 3/42
[52] U.S. Cl. ................... 327/56; 327/67; 327/75; 327/563; 327/514; 369/116; 250/205
[58] Field of Search ............................... 327/74, 75, 306, 327/67, 563, 514, 56; 250/205; 369/116

[56] References Cited

U.S. PATENT DOCUMENTS

| | | | |
|---|---|---|---|
| 3,597,761 | 8/1971 | Fraschilla | 340/347 AD |
| 3,648,141 | 3/1972 | Scheer | 318/314 |
| 3,686,493 | 8/1972 | Schmid | 235/793 |
| 3,999,133 | 12/1976 | Lee et al. | 307/650 |
| 4,008,468 | 2/1977 | Imhoff et al. | 340/347 |
| 4,039,859 | 8/1977 | Horninger | 327/3 |
| 4,479,057 | 10/1984 | Karpowycz | 250/343 |
| 4,542,370 | 9/1985 | Yamada et al. | 341/133 |
| 4,571,579 | 2/1986 | Krynicki | 340/347 |
| 4,774,499 | 9/1988 | Mapleston | 341/158 |
| 5,248,879 | 9/1993 | Turvy, Jr. | 250/205 |

FOREIGN PATENT DOCUMENTS

| | | | |
|---|---|---|---|
| 0211415 | 2/1987 | European Pat. Off. | H04N 5/782 |
| 2846207 | 5/1980 | Germany | H03G 3/00 |

*Primary Examiner*—Peter S. Wong
*Assistant Examiner*—Shawn Riley
*Attorney, Agent, or Firm*—Joseph S. Tripoli; Eric P. Herrmann; Daniel E. Sragow

[57] ABSTRACT

A control circuit for maintaining the mean value of the amplitudes of control pulses having a first level and data pulses having a second level includes a detector for providing the control pulses and the data pulses. A reference voltage source provides first, second and third reference voltages having three different levels. A plurality of comparators each receive both the control pulses and the data pulses. A first comparator also receives the lowest of the reference voltages and provides regulation pulses when the control pulses reach the level of the lowest reference voltage. A second comparator receives the second highest reference voltage and provides level limiting pulses to maintain the level of the regulation pulses constant. A third of the comparators receives the highest reference voltage and provides data pulses when the third reference voltage is reached.

5 Claims, 3 Drawing Sheets

CIRCUIT ARRANGEMENT FOR REGULATING SIGNALS

This is a continuation of application Ser. No. 08/009468 filed on 26 Jul. 1993 now abandoned.

This is a continuation of PCT application PCT/EP 91/00937, filed May 21, 1991 by Gunter Gleim, Albrecht Rothermel and Karen Rothermel and titled "Circuit Arrangement For Regulating Signals"

BACKGROUND OF THE INVENTION

This invention is directed to a circuit arrangement for regulating signals having differing amplitudes to maintain a signal at a predetermined constant level. The invention is useful with compact disc players and video tape recorders/players and other equipment having a rotating member. In such equipment signals having different levels are generated using photoelectric detectors and a pattern of lines, which is disposed on a member arranged to rotate in the proximity of the photoelectric detector, for example the perimeter of the rotor of a motor. The lines generate, by means of a light sensitive element, pulses which can be utilized for the commutation, speed and phase regulation of the drive motor. The pattern is composed of lines having a constant, narrow width arranged at equal spacing perpendicular to the direction of scanning. Some lines may be wider and serve to generate a switching signal used for the purpose of reversing the recording or, switching playback heads of a magnetic recording apparatus if the motor is the drum head cylinder motor of a video apparatus. However, the widths of the lines in the pattern are subject to tolerance variations. The photoelectric barrier also exhibits tolerance variations in its efficiency so that the peak values of the output signal are not constant. It is known to regulate the reference level R of the photoelectric barrier signal to a constant value. The amplitude of the signal pulses generated becomes independent of the coupling factor of the photoelectric barrier. However, with such a measure, differences in the ray trace of the photoelectric barrier, such as the focusing of the light beam, as well as deviations of the line width for different line patterns may still lead to differing signal amplitudes making it difficult to distinguish between two different levels.

SUMMARY OF THE INVENTION

It is an object of the invention to provide a signal regulation circuit which is independent of the characteristics and tolerances of the signal generator. The invention is advantageous in that the photoelectric detector, consisting of a light source, an optical screen and a light sensor, can be constructed with wider tolerances, and thus be less expensive, and therefore also permitting the use of a less expensive rotor for the motor on which the line pattern is disposed.

BRIEF DESCRIPTION OF THE DRAWINGS

The invention is described with reference to the drawings, in which.

BRIEF DESCRIPTION OF THE PREFERRED EMBODIMENT

Figure 1:
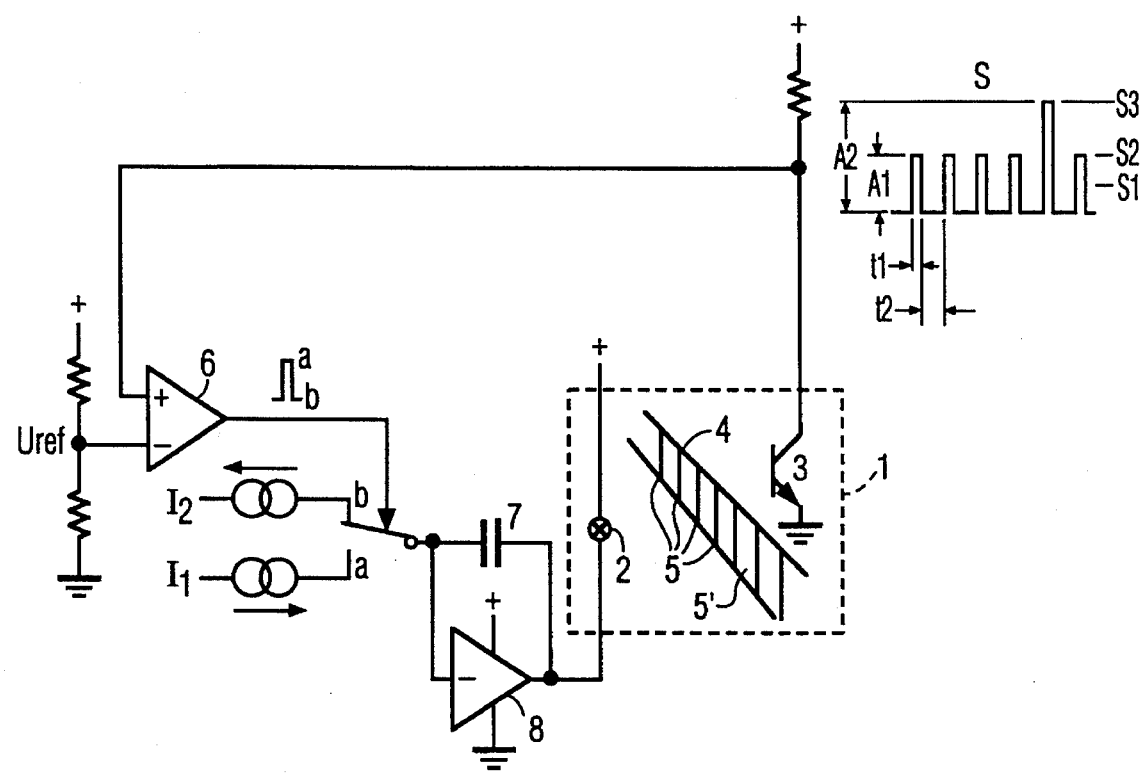
FIG. 1 shows a circuit useful in understanding the principle of the invention.

In FIG. 1, a prior art signal generator 1 consists of a light source 2 and a light sensor 3. A screen 4 is provided with optical lines and is moveably arranged between light source 2 and sensor 3. The lines on the optical screen 4 can be rigidly coupled to the head wheel of a head cylinder motor. They consist of, for example, dark lines 5 and 5' which are equally spaced around the perimeter and serve in the synchronization, phase regulation, or speed regulation of the motor. The lines 5' are distinguished from the lines 5 by a greater width. The wider lines are used to generate data signals which indicate that a function must be performed, for example to generate a head reversal signal. Depending on the width of the line passing by the photoelectric barrier, pulse signals S with different peak values are provided at the output terminal of the signal generator 1. The broad lines 5' generate the data pulses having a peak value A2. Control pulses having a peak value A1, typically less than A2, are generated by the narrow lines 5. The A2 level pulses are used as control pulses to control a function, such as the phase or speed of a rotating member. The control pulses with the peak value A1 have a certain and constant pulse-to-pause ratio t1:t2 at any rotational speed of the motor and thus, also the screen 4. The sensor signal is applied to the positive (+) input terminal of a comparator 6. The negative (−) input terminal of comparator 6 receives a reference potential Uref, which corresponds to the average value of the positive peak values of the pulses with the desired peak value A1. Thus, when seen over a sufficiently long period of time, about half of the pulses with the peak value A1 will exceed the reference potential Uref while the other half of the pulses will fail to do so. When the predetermined reference potential Uref is exceeded the output level of the comparator 6 rises and switches on a current source to provide a current I1 and reverse charge a capacitor 7. The change on capacitor 7 is amplified by a regulating voltage amplifier 8 and the voltage on the output terminal of the amplifier 8 decreases. The voltage decrease causes the light source 2 to provide a brighter output light. When the voltage on the positive terminal of comparator 6 is below the reference potential Uref, or between the line marks, the output of the comparator 6 is a low potential and the current source 12 is switched on to reverse charge the capacitor 7 in the opposite direction. The signal change at the comparator 6 generates an increase in the potential on the output terminal of the regulating voltage amplifier 8 and the light source 2 provides a dimmer light output. The currents I1 and I2 are set in such a way that they correspond to about half the pulse-to-pause ratio of the sensor signal, i.e. there flows a large current I1 during the time t1 of the pulses and a relatively small current I2 flows during the time t2 of the pauses. In tests of a circuit built as shown in FIG. 2 the ratio of the currents I1 and I2 is approximately 50:1.

Figure 2:
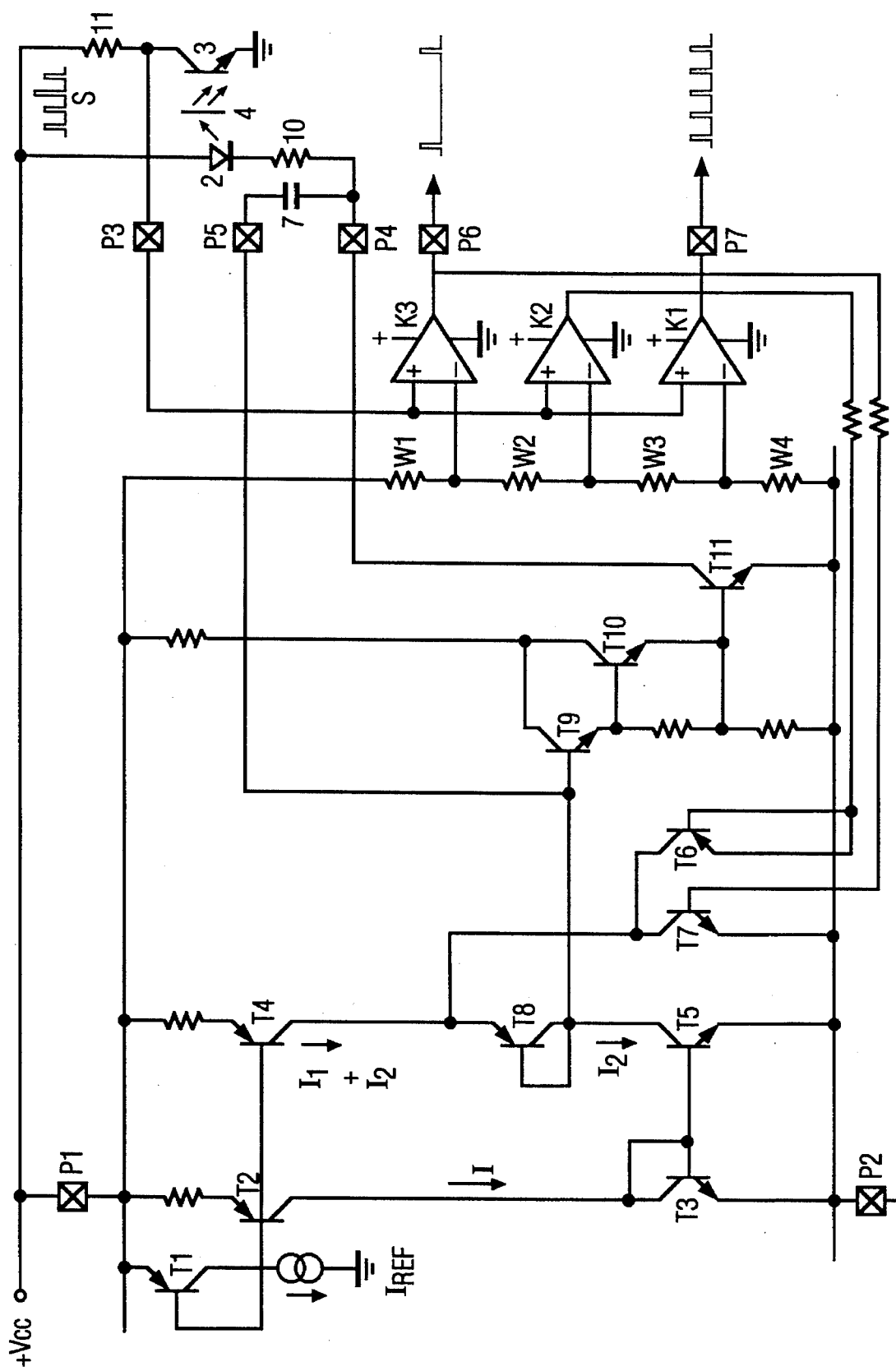
FIG. 2 is a preferred embodiment.

The arrangement shown in FIG. 2 is particularly suitable for integrated circuit technology. The operating voltage +Vcc is applied to the terminal P1 of the circuit. The terminal P2 is coupled to the reference potential (ground in this embodiment) of the operating voltage. The light sensing element 3, for example a phototransistor, is connected to the terminal P3 and to the operating voltage Vcc at terminal P1 by a resistor 11. The terminal P4 is coupled via a series resistor 10 and via a light emitting element 2, for example a light emitting diode, to the operating voltage Vcc at terminal P1. A capacitor 7 is coupled to terminal P4, the other end of capacitor 7 is coupled to a terminal P5. The head switching signal is available at the terminal P6. The commutation pulses are available at terminal P7. Using a reference current source Iref and a transistor T1, currents (I1+I2) and (I2) are generated via current mirrors T2, T3 and T4, T5. The ratio of I2 to I1 is about 1:50. Three comparators K1, K2 and K3 compare the sensor signal S with three threshold values S1, S2 and S3, which are predetermined by the resistors W1, W2, W3 and W4. When the first threshold value S1, determined by the comparator K1, is reached a pulse is generated at output terminal P7. Whenever the pulse peaks of the sensor signal S are below the threshold value S2, corresponding to the value predetermined for the regulation, the output of the comparator K2 lies at reference potential so that the current I1+I2 flows to ground via the transistor T6, which is wired as a diode. The transistor T8, which also is wired as a diode, is blocked, and the current I2 flows and reverse charges the capacitor 7 until the sensor signal S reaches the threshold value S2. At this instance the output of comparator K2 goes up thereby blocking transistor T6. The current I1+I2 no longer flows through transistor T6 but, rather, is split in the node behind transistor T8 into the current I1, which charges capacitor 7, and into the current I2, which flows through transistor T5. The base current of transistor T9 is negligible in this case. The charging time constant of capacitor 7 is selected sufficiently large that, in normal operation, the charge on the capacitor is only slightly changed with each pulse. The result is the steady regulation of the pulses exactly when the mean of the peak values of the pulses has been adjusted to the switching threshold of the comparator K2. The voltage value resulting at terminal P5 of capacitor 7 is amplified via the regulation amplifier including transistors T9, T10 and T11. The amplified regulation signal is impressed upon the light emitting element 2 in such a way that it is regulated to become brighter with a decreasing peak value and dimmer with an increasing peak value. The capacitor 7 in conjunction with the amplifier act as integrator. When the third threshold value S3 is reached the output of comparator K3 goes up so that transistor T7 is controlled to be conductive and the current I1 again flows towards reference potential. In this case the current I2 becomes effective in discharging capacitor 7. The potential at terminal P5 drops, the potential at terminal P4 rises, and the current through the light emitting element 2 is reduced.

Figure 3A:
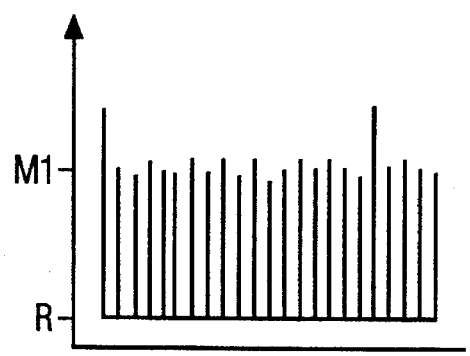
FIGS. 3a to 3d are diagrams illustrating the operation of the invention,.
Figure 3B:
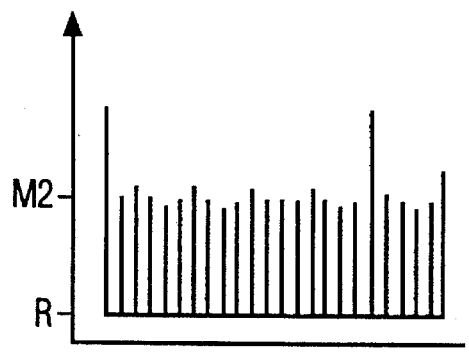
Figure 3C:
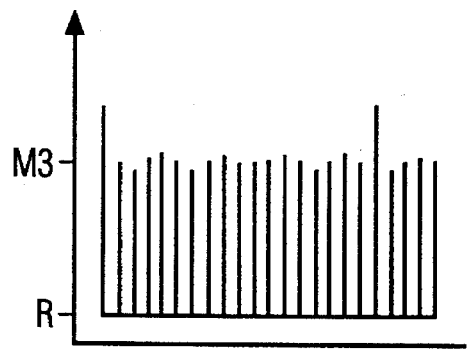
Figure 3D:
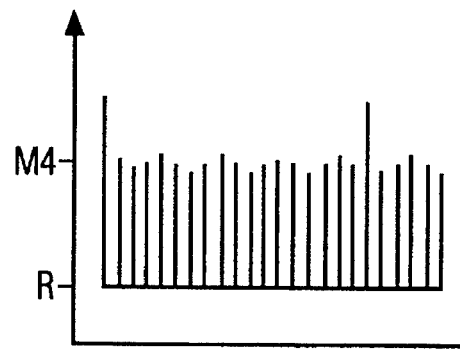

FIGS. 3a to 3d show the effect of using the invention. In FIGS. 3a and 3b the output pulses from two different sensors using conventional regulation are plotted. It can be seen that the mean M1 of the positive peak values of the pulses shown in FIG. 3a is greater than the mean M2 of the positive peak values shown in FIG. 3b. FIG. 3c and FIG. 3d show the pulse diagrams of two different sensors when the invention is used. The mean M3 of the higher positive peak values and the mean M4 of the lower positive peak values are equal even although the peak-peak values of the pulses are different.

The invention is not limited to the exemplary application, as just described, with a signal which is generated by a line pattern on the perimeter of the rotor of a motor. The regulating circuit according to FIG. 2 operates and reacts in a similar manner with respect to other similar signals which are fed to the terminal P3. The signals may originate from any one of many types of equipment having a rotating member and which uses a photoelectric barrier, for example a conveyor belt.

We claim:

1. A control circuit for maintaining a mean value of amplitudes of generated pulses having different levels and representing different functions whereby pulses of a first level represent control pulses and pulses of a second level represent data pulses indicating that a function must be performed, comprising:

a detector for providing said generated pulses;

means for adjusting the mean level of said generated pulses;

a reference voltage source for providing first, second and third reference voltages having three different levels;

first, second and third comparators, each of said comparators receiving said generated pulses and a corresponding one of said reference voltages, a first of said comparators receiving the lowest reference voltage level and producing control pulses when said generated pulses reach said lowest reference voltage, a second of said comparators receiving the second highest reference voltage level and producing level limiting pulses to said adjusting means to maintain the mean level of said generated pulses constant, and a third of said comparators receiving the highest reference voltage and producing data pulses when said third reference voltage is reached; and means for inhibiting said adjusting means in response to said data pulses, so that said adjustment means does not respond to said data pulses.

2. The circuit of claim 1, further including at least two constant sources providing two levels of current, a first of said current sources being turned on and off by said second comparator and a second of said current sources being turned on and off by said third comparator; and means for applying said currents to said light emitting diode.

3. The circuit of claim 2 further including a capacitor for storing a voltage level representative of said pulses of a first level.

4. The circuit of claim 3 wherein said second comparator controls the charge and discharge of said capacitor.

5. The circuit of claim 4 wherein said detector is a photoelectric detector having a light emitting diode and a light sensitive element, and wherein said control circuit changes a light output of said light emitting diode in response to said level limiting pulses.

* * * * *